(12) United States Patent  (10) Patent No.: US 9,120,114 B2
Jeong  (45) Date of Patent: Sep. 1, 2015

(54) DEPOSITION APPARATUS

(71) Applicant: ASM IP Holding B.V., Almere (NL)

(72) Inventor: Sang-Jin Jeong, Cheonan-si (KR)

(73) Assignee: ASM IP HOLDINGS B.V., Almere (NL)

( * ) Notice: Subject to any disclaimer, the term of this patent is extended or adjusted under 35 U.S.C. 154(b) by 125 days.

(21) Appl. No.: 13/948,245

(22) Filed: Jul. 23, 2013

(65) Prior Publication Data

US 2014/0041579 A1  Feb. 13, 2014

(30) Foreign Application Priority Data

Aug. 7, 2012 (KR) .......................... 10-2012-0086336

(51) Int. Cl.
*B05C 13/00* (2006.01)
*C23C 16/458* (2006.01)
*H01L 21/687* (2006.01)

(52) U.S. Cl.
CPC ............. *B05C 13/00* (2013.01); *C23C 16/4583* (2013.01); *H01L 21/68742* (2013.01)

(58) Field of Classification Search
CPC ................ B05C 13/00; C23C 16/4583; H01L 21/68792; B24B 37/30; B24B 37/10; B25B 11/002
USPC .......... 118/728, 500; 451/398, 402, 285–290, 451/388; 279/3; 269/21, 903, 75; 384/192, 384/205, 206–210
See application file for complete search history.

(56) References Cited

U.S. PATENT DOCUMENTS

| 5,421,893 | A | 6/1995 | Perlov | |
| 6,560,856 | B1 * | 5/2003 | Prater | ............................ 29/724 |
| 2006/0156987 | A1 | 7/2006 | Lai | |

FOREIGN PATENT DOCUMENTS

SU  1087196  * 4/1984

* cited by examiner

*Primary Examiner* — Laura Edwards
(74) *Attorney, Agent, or Firm* — LEX IP Meister, PLLC

(57) ABSTRACT

A deposition apparatus includes a substrate supporting pin that is fixed to a supporting plate through an autoalignment control unit to prevent the substrate supporting pin from being broken when loading or unloading a substrate, thereby preventing damaging the substrate and also preventing decreased yield that may result due to the breakage of the substrate supporting pin.

10 Claims, 6 Drawing Sheets

DEPOSITION APPARATUS

CROSS-REFERENCE TO RELATED APPLICATION

This application claims priority to and the benefit of Korean Patent Application No. 10-2012-0086336 filed in the Korean Intellectual Property Office on Aug. 7, 2012, the entire contents of which are incorporated herein by reference.

BACKGROUND OF THE INVENTION (a) Field of the Invention

The present invention relates to a deposition apparatus.

(b) Description of the Related Art

In a deposition apparatus that is used to deposit a predetermined film on a silicon substrate, a substrate supporting pin or a substrate lift pin is used to load or unload a substrate before and after a process.

The substrate supporting pin includes a fixed supporting pin and a non-fixed supporting pin. The fixed supporting pin has a shape of which a lower part of the substrate supporting pin is fixed to a lift pin supporter. In the case of the fixed supporting pin, the substrate supporting pin may be damaged due to friction with a lift pin hole formed on a susceptor or a heater.

In the non-fixed substrate supporting pin, the substrate supporting pin moves vertically when loading and unloading the substrate and the substrate supporting pin is suspended on a substrate supporting pin hole when the substrate supporting pin moves vertically. As a result, the substrate supporting pin may be damaged.

As such, when the supporting pin is damaged or a vertical axis on which the substrate supporting pin moves is deformed, the substrate may not be loaded and unloaded accurately, and thus, the substrate may be even damaged. Further, when the substrate is not loaded at an accurate position, process gas penetrates a rear surface of the substrate, and as a result, an unnecessary thin-film may be deposited or contaminated particles may be generated in a reactor.

The above information disclosed in this Background section is only for enhancement of understanding of the background of the invention, and therefore, it may contain information that does not form the prior art that is already known to a person of ordinary skill in the art.

SUMMARY OF THE INVENTION

The present invention has been made in an effort to provide a deposition apparatus that can reduce or avoid damage of a substrate supporting pin and prevent the substrate supporting pin or a substrate from being damaged by preventing friction force which may be generated in a hole into which the substrate supporting pin is inserted by allowing the substrate supporting pin to move to a desired position, at the time of loading and/or unloading the substrate by using the substrate supporting pin.

An exemplary embodiment of the present invention provides a deposition apparatus, including: a substrate supporter, a substrate supporting pin inserted into a first hole formed in the substrate supporter, an autoalignment control unit connected to a lower part of the substrate supporting pin, and a supporting plate connected to the autoalignment control unit to support the substrate supporting pin.

The autoalignment control unit may include a weight attached to an end portion of the substrate supporting pin.

The autoalignment control unit may further include a housing housing the weight, and the housing may have a second hole.

The substrate supporting pin may be inserted into the second hole of the autoalignment control unit.

The deposition apparatus may further include an alignment guide ring disposed between the housing and the weight.

In one aspect of the invention, a radius of the second hole may be equal to or smaller than an inner radius of the alignment guide ring.

The second hole may have an oval plane shape. Or alternatively, the second hole may have a circular plane shape.

The weight and the alignment guide ring may be made of Teflon or ceramic.

According to the exemplary embodiment of the present invention, in a deposition apparatus, an autoalignment control unit is formed on a supporting pin supporter to which a fixed substrate supporting pin is fixed and the autoalignment control unit includes a direction control unit, such as a weight and an alignment guide ring, to automatically align a hole inserted with the supporting pin and a vertical movement axis of the substrate supporting pin, thereby preventing the substrate supporting pin from being broken or damaged due to internal friction with the hole. As a result, it is possible to prevent damaging the substrate, avoiding decrease in yield due to the breakage of the substrate supporting pin.

DETAILED DESCRIPTION OF THE EXEMPLARY EMBODIMENTS

Figure 1:
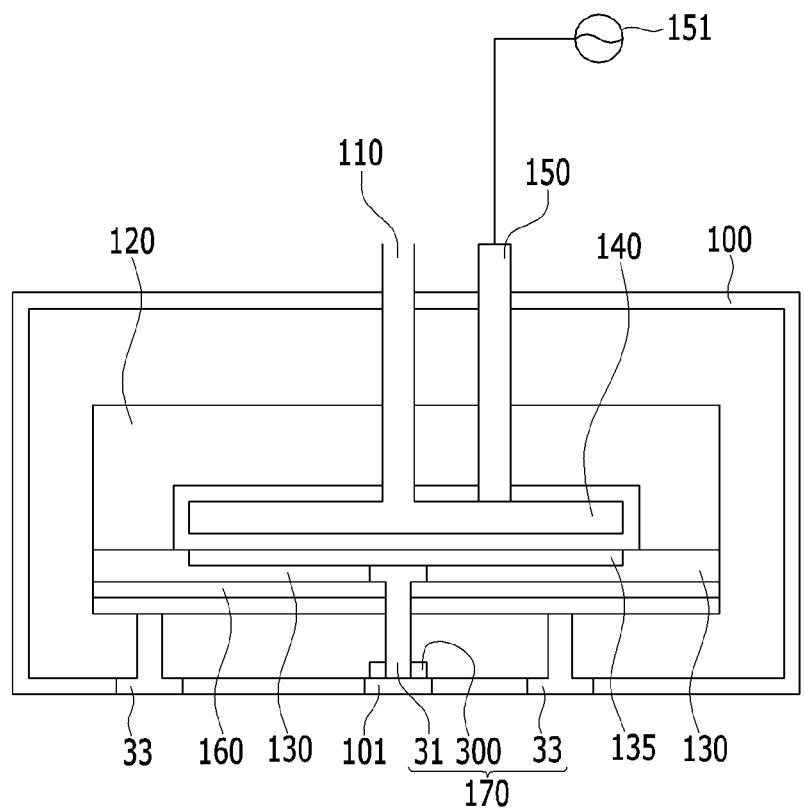
FIG. 1 is a cross-sectional view of a deposition apparatus according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., may have been exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, referring to FIG. 1, a deposition apparatus according to an exemplary embodiment of the present invention will be described. FIG. 1 is a cross-sectional view of a deposition apparatus according to an exemplary embodiment of the present invention.

Referring to FIG. 1, the deposition apparatus according to the exemplary embodiment of the present invention includes an outer wall 100, a gas passage pipe 110, a reaction chamber wall 120, a substrate supporter 130, a reaction chamber plate 140 defining a reaction space together with the substrate supporter 130, a high-frequency connection terminal 150 for transferring high-frequency power to the reaction chamber plate 140 in order to induce plasma into a reaction chamber, and a high-frequency power supply 151 connected to the high-frequency connection terminal 150.

Each constituent member will be described in more detail.

A substrate 135 is disposed on the substrate supporter 130 as a deposition target and a heating plate 160 is disposed below the substrate supporter 130. The heating plate 160 serves to increase the temperature of the substrate 135 to a temperature required for the process and may be omitted.

A substrate supporter driving unit 170 for driving the substrate supporter 130 in order to load and unload the substrate 135 includes a substrate supporting pin 31 inserted into a hole formed in the substrate supporter 130 to support the substrate 135 and a vertical driving unit 33 controlling vertical movement of the substrate supporter 130. As the vertical driving unit 33, various means controlling the vertical movement of the substrate supporter 130, such as a pneumatic cylinder, and the like may be used. The substrate supporting pin 31 may be supported on a supporting plate 101 formed therebelow. The substrate supporting pin 31 is connected with a supporting plate 101 through an autoalignment control unit 300.

Then, the vertical movement of the substrate supporter 130 for loading and unloading the substrate will be described. Before and after the deposition process, the substrate supporter 130 and the heating plate 160 connected to the vertical driving unit 33 move downward to separate the reaction chamber wall 120 from the substrate supporter 130. As a result of the separation, the reaction chamber is opened to thereby load or unload the substrate 135 in or out of the reaction chamber. In this case, the substrate supporter 130 and the heating plate 160 may partially move in a horizontal direction and the substrate supporting pin 31 may also be moved in the horizontal direction along the substrate supporter 130 and the heating plate 160 by the autoalignment control unit 300.

Referring to FIGS. 2 to 5, the substrate supporting pin 31, the supporting plate 101 supporting the substrate supporting pin 31, and the autoalignment control unit 300 of the deposition apparatus according to the exemplary embodiment of the present invention will be described.

Figure 2:
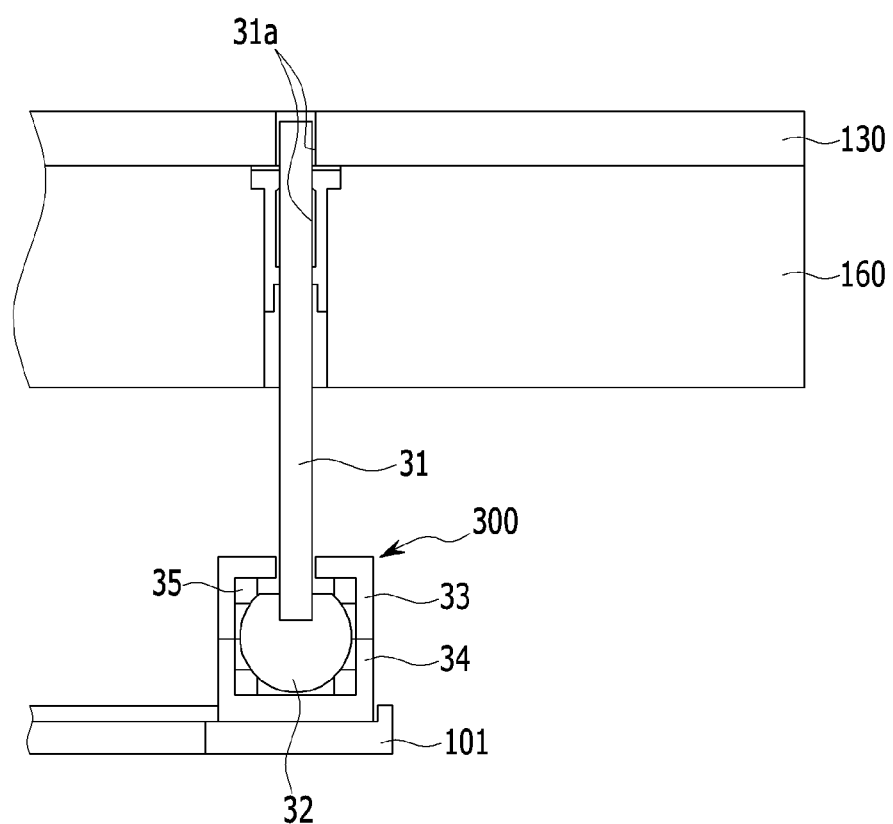
FIG. 2 is a cross-sectional view illustrating a part of the deposition apparatus according to the exemplary embodiment of the present invention.
Figure 3:
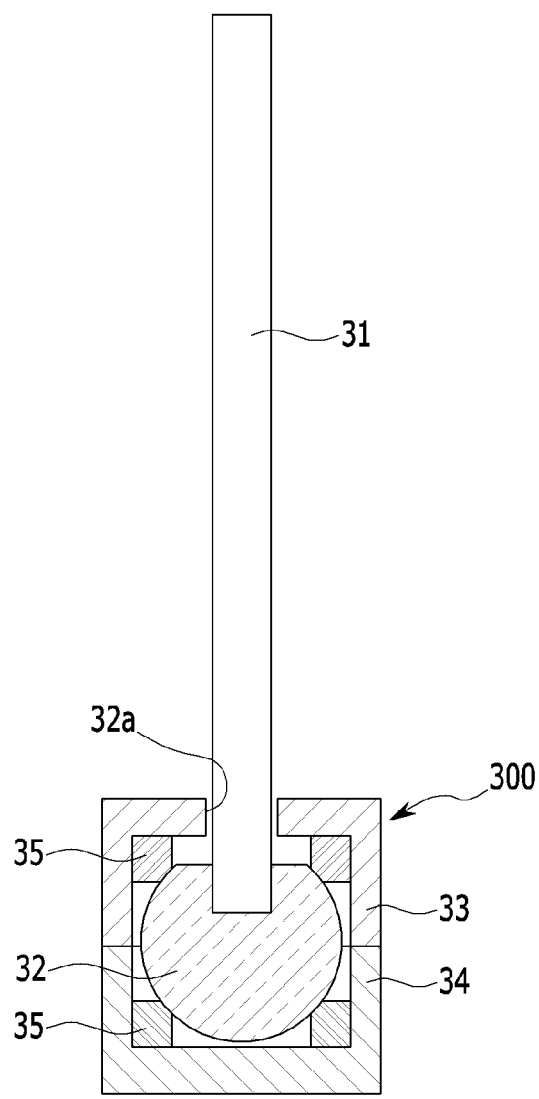
FIG. 3 is a diagram illustrating one example of an automatic alignment member of a substrate supporting pin according to an exemplary embodiment of the present invention.
Figure 4:
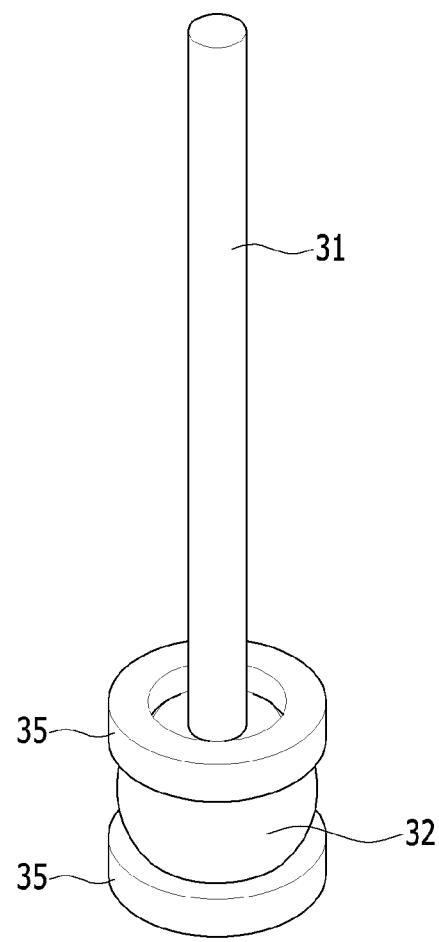
FIG. 4 is a diagram illustrating a part of the automatic alignment member of the substrate supporting pin according to an exemplary embodiment of the present invention.
Figure 5:
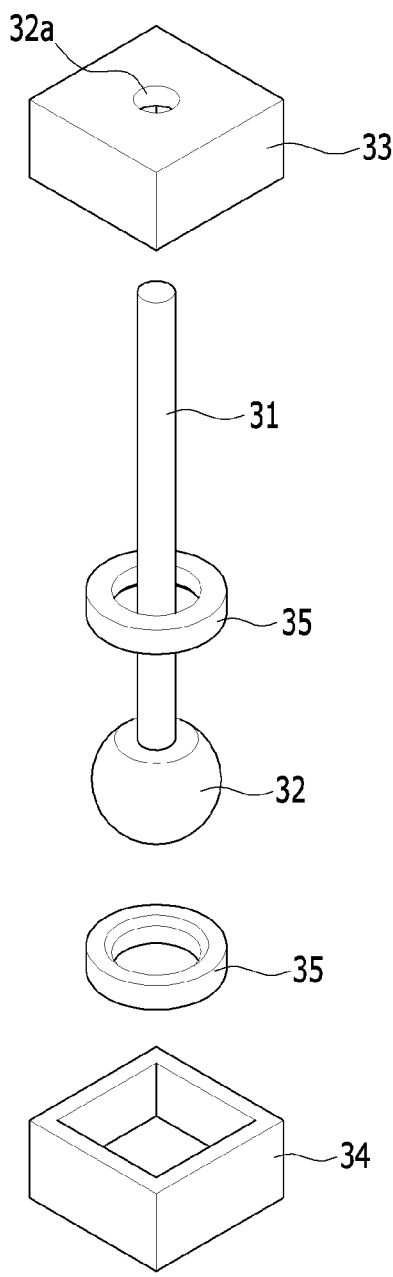
FIG. 5 is an exploded perspective view of the automatic alignment member of the substrate supporting pin according to an exemplary embodiment of the present invention.

FIG. 2 is a cross-sectional view of a part of the deposition apparatus according to the exemplary embodiment of the present invention. FIG. 3 is a diagram illustrating one example of an automatic alignment member of a substrate supporting pin according to an exemplary embodiment of the present invention. FIG. 4 is a diagram illustrating a part of the automatic alignment member of the substrate supporting pin according to an exemplary embodiment of the present invention. FIG. 5 is an exploded perspective view of the automatic alignment member of the substrate supporting pin according to an exemplary embodiment of the present invention.

Referring to FIG. 2, one end portion of the substrate supporting pin 31 is inserted into a first hole 31a formed in the substrate supporter 130 and the heating plate 160. The other end portion of the substrate supporting pin 31 is inserted into the autoalignment control unit 300. The autoalignment control unit 300 may be attached onto the supporting plate 101. The autoalignment control unit 300 includes a weight 32 connected to the end of the substrate supporting pin 31, an upper housing 33 and a lower housing 34 housing the weight 32, and two alignment guide rings 35, a first alignment guide ring being disposed at an upper portion of the weight 32 and a second alignment guide ring being disposed at a lower portion of the weight 32.

Referring to FIGS. 3 to 5, the substrate supporting pin 31 and the autoalignment control unit 300 will be described. As illustrated in FIG. 4, the weight 32 may have a spherical shape and the alignment guide rings 35 surround the upper and lower portions of the weight 32 to assist rotation of the weight 32 and the substrate supporting pin 31 connected thereto. In order to minimize friction between the weight 32 and the alignment guide rings 35, the alignment guide rings 35 are made of a material having a small friction coefficient. For example, at least the weight 32 or the alignment guide rings 35 may be made of Teflon or ceramic.

Referring to FIGS. 3 to 5, the weight 32 is connected to a lower part of the substrate supporting pin 31 and the alignment guide rings 35 are positioned at the upper and lower portions of the weight 32. Therefore, the substrate supporting pin 31 is movable horizontally within an inner radius of the alignment guide rings 35. That is, a horizontal path through which the substrate supporting pin 31 is maximally movable may be the inner radius of the alignment guide rings 35.

Referring to FIG. 5, a second hole 32a into which the substrate supporting pin 31 is inserted is formed in the upper housing 33, but a range in which the substrate supporting pin 31 is movable horizontally depends on the size and the shape of the second hole 32a That is, the maximum horizontal path through which the substrate supporting pin 31 is movable is the inner radius of the alignment guide rings 35, but since the weight 32 and the alignment guide rings 35 are housed in the upper housing 33 and the lower housing 34, a range in which the substrate supporting pin 31 is actually movable is determined based on the size and the shape of the second hole 32a formed through the upper housing 33. A horizontal radius of the second hole 32a formed through the upper housing 33 may be equal to or smaller than the inner radius of the alignment guide rings 35.

Figure 6:
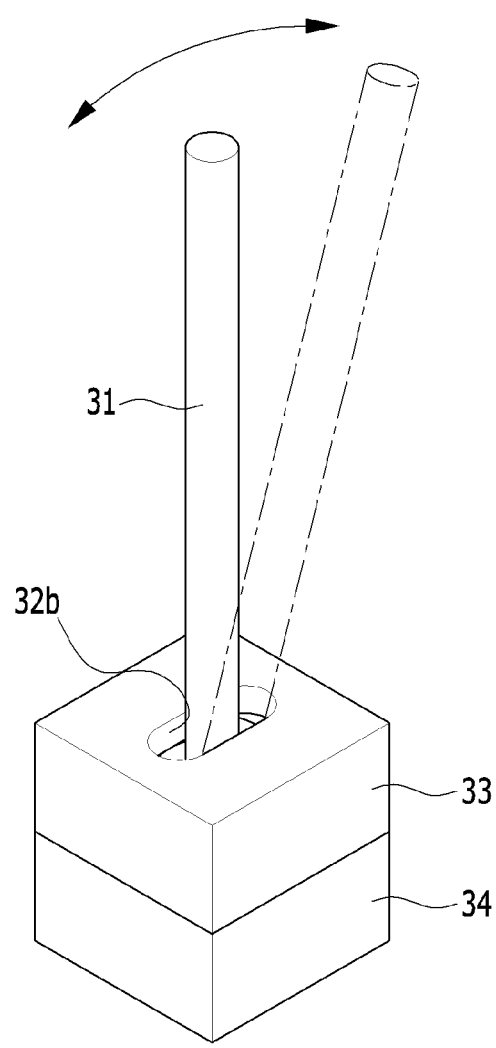
FIG. 6 is a diagram illustrating a part of the deposition apparatus and an operation thereof according to an exemplary embodiment of the present invention.

The second hole 32a formed through the upper housing 33 and movement of the substrate supporting pin 31 therethrough will be described with reference to FIG. 6. FIG. 6 is a diagram illustrating a part of the deposition apparatus and an operation thereof.

Referring to FIG. 6, the second hole 32a formed through the upper housing 33 may have an oval shape which is elongated in a horizontal direction. In this case, the substrate supporting pin 31 is movable in the horizontal direction of the second hole 32a formed through the upper housing 33 and a maximum movement range thereof is determined based on the size of the second hole 32a. The second hole 32a of the deposition apparatus according to the exemplary embodiment illustrated in FIG. 6 is one example and the deposition apparatus according to the exemplary embodiment of the present invention is not limited thereto and may have an insertion hole having a shape other than the oval shape. For example, the second hole 32a may have a circular or oval plane shape.

Accordingly, the substrate supporting pin 31 of the deposition apparatus according to the exemplary embodiment of the present invention is connected to the autoalignment control unit 300 attached to the supporting plate 101. See FIGS.

2 and 3. Therefore, the substrate supporting pin 31 is movable horizontally within a range determined by the autoalignment control unit 300.

Therefore, when the substrate supporter 130 and the heating plate 160 move vertically, the position of the substrate supporting pin 31 is also changeable. Therefore, it is possible to prevent damaging the substrate supporting pin 31 due to friction force which may be generated when a vertical movement axis of the first hole 31a and a vertical axis of the substrate supporting pin 31, that is, when the vertical movement axis of the first hole 31a and the vertical axis of the substrate supporting pin 31 do not coincide with each other.

Referring back to FIG. 1, when the substrate supporter 130 and the heating plate 160 move vertically, the substrate supporter 130 and the heating plate 160 may be movable horizontally. In this case, the substrate supporting pin 31 fixed to the supporting plate 101 without the autoalignment control unit 300 may be broken as friction is generated in the first hole 31a formed in the substrate supporter 130 and the heating plate 160. However, in the deposition apparatus according to the exemplary embodiment of the present invention, as illustrated in FIGS. 2 to 6, since the substrate supporting pin 31 is attached to the supporting plate 101 through the autoalignment control unit 300, the substrate supporting pin 31 is automatically aligned to move in a moving direction of the first hole 31a formed in the substrate supporter 130 and the heating plate 160, in accordance with the horizontal movement of the substrate supporter 130 and the heating plate 160.

As discussed, the deposition apparatus according to the exemplary embodiment of the present invention includes the autoalignment control unit 300 formed between the substrate supporting pin 31 and the supporting plate 101 to prevent breakage of the substrate supporting pin 31 that may be resulted due to the movement of the substrate supporter 130 and the heating plate 160.

Shapes and layouts of a substrate supporting pin, a substrate supporting pin protection member, and a substrate supporting pin guide member of the deposition apparatus according to the exemplary embodiments described above are just examples for describing the present invention and the present invention is not limited thereto and may be changed in various forms.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus, comprising:
an outer wall forming an enclosed space;
a reaction chamber wall disposed in the enclosed space;
a substrate supporter disposed in the enclosed space and defining a reaction space together with the reaction chamber wall;
a reaction chamber plate disposed in the reaction space;
a gas passage pipe penetrating through the outer wall and the reaction chamber wall;
a substrate supporting pin inserted into a first hole formed in the substrate supporter;
an autoalignment control unit connected to a lower part of the substrate supporting pin; and
a supporting plate connected to the autoalignment control unit to support the substrate supporting pin,
wherein the substrate supporting pin is movably held by the autoalignment control unit.

2. The deposition apparatus of claim 1, wherein:
the autoalignment control unit includes a weight attached to an end portion of the substrate supporting pin.

3. The deposition apparatus of claim 2, wherein:
the autoalignment control unit further includes a housing housing the weight, and
the housing has a second hole and the substrate supporting pin is inserted into the second hole of the autoalignment control unit.

4. The deposition apparatus of claim 3, further comprising:
an alignment guide ring disposed between the housing and the weight.

5. The deposition apparatus of claim 4, wherein:
a radius of the second hole is equal to or smaller than an inner radius of the alignment guide ring.

6. The deposition apparatus of claim 5, wherein:
the second hole has an oval plane shape.

7. The deposition apparatus of claim 5, wherein:
the second hole has a circular plane shape.

8. The deposition apparatus of claim 4, wherein:
the alignment guide ring is made of polytetrafluoroethylene or ceramic.

9. The deposition apparatus of claim 3, wherein:
the second hole has an oval plane shape.

10. The deposition apparatus of claim 3, wherein:
the second hole has a circular plane shape.

* * * * *